United States Patent
Tamasi et al.

(10) Patent No.: US 7,478,289 B1
(45) Date of Patent: Jan. 13, 2009

(54) SYSTEM AND METHOD FOR IMPROVING THE YIELD OF INTEGRATED CIRCUITS CONTAINING MEMORY

(75) Inventors: Anthony M. Tamasi, San Jose, CA (US); Oren Rubenstein, Sunnyvale, CA (US); Srihari Vegesna, San Jose, CA (US); Jue Wu, San Jose, CA (US); Sean J. Treichler, Mountain View, CA (US)

(73) Assignee: NVIDIA Corporation, Santa Clara, CA (US)

( * ) Notice: Subject to any disclaimer, the term of this patent is extended or adjusted under 35 U.S.C. 154(b) by 599 days.

(21) Appl. No.: 11/145,143

(22) Filed: Jun. 3, 2005
(Under 37 CFR 1.47)

(51) Int. Cl.
*G11C 29/44* (2006.01)
*G11C 29/50* (2006.01)

(52) U.S. Cl. .................. 714/718; 714/710
(58) Field of Classification Search ............ None
See application file for complete search history.

(56) References Cited

U.S. PATENT DOCUMENTS

| | | | | |
|---|---|---|---|---|
| 5,249,280 A * | 9/1993 | Nash et al. | ...... | 711/5 |
| 6,476,807 B1 * | 11/2002 | Duluk et al. | ...... | 345/421 |
| 6,553,521 B1 * | 4/2003 | Rathei et al. | ...... | 714/722 |
| 6,829,737 B1 * | 12/2004 | McBride | ...... | 714/718 |
| 6,952,659 B2 * | 10/2005 | King et al. | ...... | 702/186 |
| 6,992,937 B2 * | 1/2006 | Tran et al. | ...... | 365/200 |
| 2002/0120826 A1 * | 8/2002 | Venkatraman et al. | ...... | 711/207 |
| 2004/0267965 A1 * | 12/2004 | Vasudevan et al. | ...... | 709/250 |

* cited by examiner

*Primary Examiner*—John P Trimmings
*Assistant Examiner*—Dipakkumar Gandhi
(74) *Attorney, Agent, or Firm*—Patterson & Sheridan, LLP

(57) ABSTRACT

A system and method for increasing the yield of integrated circuits containing memory partitions the memory into regions and then independently tests each region to determine which, if any, of the memory regions contain one or more memory failures. The test results are stored for later retrieval. Prior to using the memory, software retrieves the test results and uses only the memory sections that contain no memory failures. A consequence of this approach is that integrated circuits containing memory that would have been discarded for containing memory failures now may be used. This approach also does not significantly impact die area.

5 Claims, 4 Drawing Sheets

SYSTEM AND METHOD FOR IMPROVING THE YIELD OF INTEGRATED CIRCUITS CONTAINING MEMORY

BACKGROUND OF THE INVENTION

1. Field of the Invention

Embodiments of the present invention generally relate to the field of semiconductor manufacturing, and more specifically to a system and method for improving the yield of integrated circuits containing memory.

2. Description of the Related Art

The successful manufacture of integrated circuits depends on maximizing the yield, which is the number of tested good parts that are derived from each wafer. The greater the yield, the lower the overall cost of the product. The die area of the integrated circuit has a direct correlation to the yield. As die area increases, fewer dies can be fit on each wafer. As is well-known, larger die areas are more prone to manufacturing defects as well.

Typically, complex integrated circuits are comprised of a plurality of functional units providing set functionality and performance levels. For example, there may be shader, texture and arithmetic units within a graphics processing unit all working together to provide graphics functionality. After the integrated circuit is fabricated, the device undergoes a series of tests where each functional unit is tested to ensure that the integrated circuit is fully functional. If any functional unit fails a test, the entire integrated circuit is classified as inoperable and is discarded.

In an effort to increase yield, some designers add one or more redundant functional units to the design. If a failed functional unit is found, the failed unit is disabled and is replaced with one of the redundant functional units. For example, in a design that requires three Random Access Memory (RAM) arrays, a fourth RAM array may be added as a spare to be used when one of the three required RAM arrays fails. The problem with this approach is that the redundant functional units consume significant die area. If the redundant unit is not required, then the die area occupied by the redundant functional unit is wasted, and the yield is increased at the cost of die area usage.

As the foregoing illustrates, what is needed in the art is a way to increase yield without significantly increasing die area.

SUMMARY OF THE INVENTION

One embodiment of the present invention is a computing device configured to use only regions of a memory element that do not include memory failures. The computing device includes a processor and a memory element that has been tested for memory failures. The memory element has a first region and a second region, and a first memory state indicator indicates whether the first region includes a memory failure, and a second memory state indicator indicates whether the second region includes a memory failure. In another embodiment, the computing device also includes a software driver configured to read the first memory state indicator and the second memory state indicator and determine whether to use the first region based on a setting of the first memory state indicator and whether to use the second region based on a setting of the second memory state indicator.

One advantage of the disclosed computing device is that integrated circuits containing memory that would have been discarded for containing memory failures may now be used in the computing device. This approach also does not significantly impact the die area associated with the integrated circuits.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
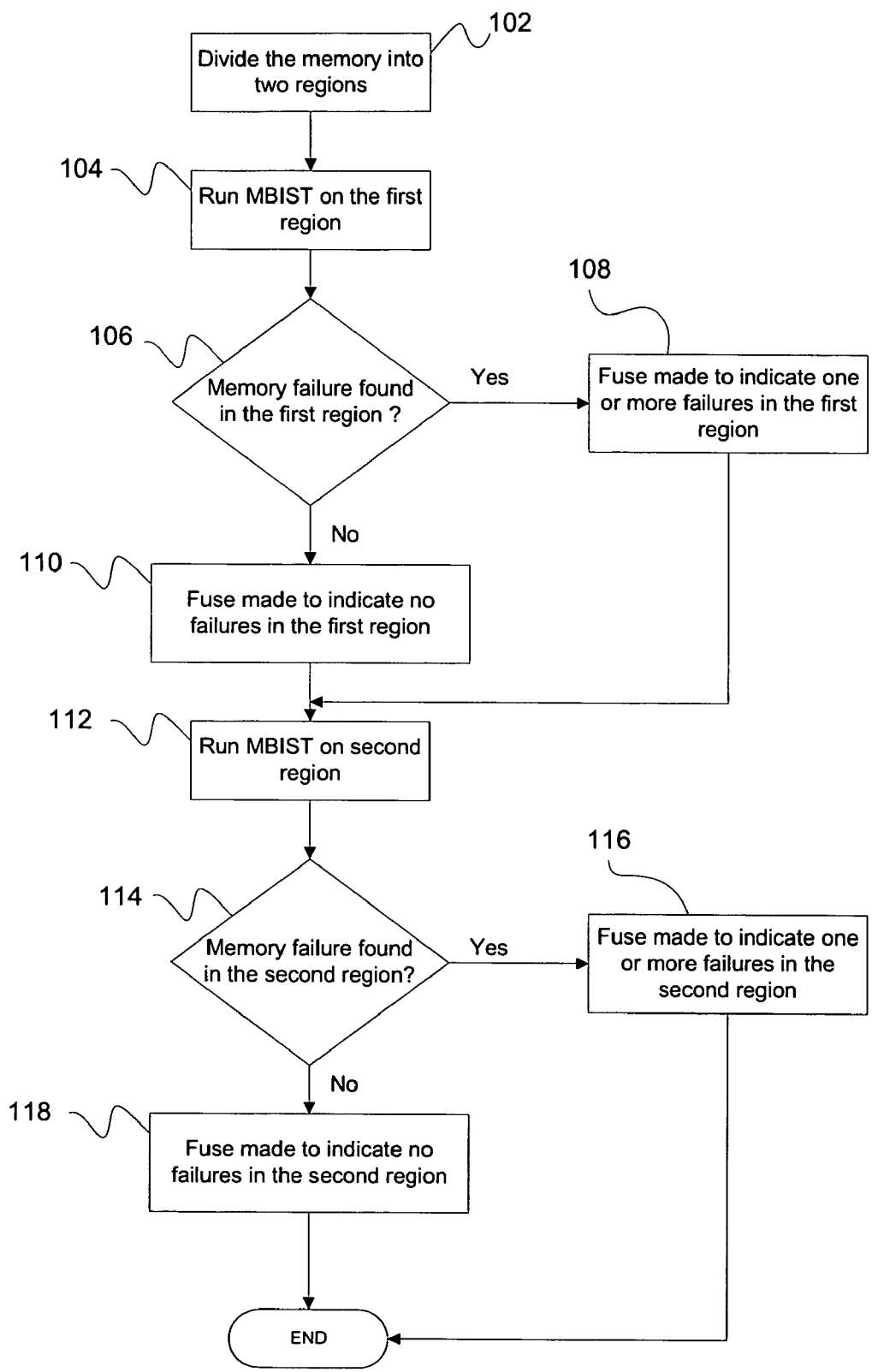
FIG. 1 is a flow chart of method steps for testing an integrated circuit containing memory, according to one embodiment of the invention.

FIG. 1 is a flow chart of method steps for testing an integrated circuit containing memory, according to one embodiment of the invention. Persons skilled in the art will understand that any system configured to perform the method steps in any order is within the scope of this invention.

As shown in FIG. 1, the method for testing an integrated circuit begins in step 102, where the memory to be tested is divided into regions. In the preferred embodiment, the memory is divided into two regions determined by the memory addresses; the lower addresses of memory are in the first memory region and the upper addresses of memory are in the second memory region. In step 104, the first memory region is tested using Memory Built-In Self-Test (MBIST).

As is well-known, MBIST is a quick and efficient means of testing and finding failures within a memory region. Typically, MBIST is implemented with state machines that are co-located on the die with the memory, and moreover, these state machines are configured to test an entire memory region. In the preferred embodiment, the MBIST state machines are aware of the divided memory regions so that each memory region may be tested independently.

In step 106, the results of the MBIST are examined. If there are no memory failures, then in step 110, a first fuse is made to indicate that no memory failures are present in the first memory region. As is also well-known, fuses are used in integrated circuits to provide a low cost and low area method of non-volatile storage. In alternative embodiments, other means of non-volatile storage may be used to indicate the state of the different memory regions, such as Programmable Read Only Memory, (PROM), Erasable Programmable Read Only Memory, (EPROM), Electrically Erasable Programmable Read Only Memory (EEPROM) or the like. If one or more memory failures are detected in step 106, the method proceeds to step 108, where the first fuse is made to indicate that memory failures are present in the first memory region. In step 112, the second region of memory is tested using MBIST, and, in step 114, the results of the test are examined. If there are no memory failures in the second region, then in step 118, a second fuse is made to indicate that no memory failures are present in the second region and the method terminates. If one or more memory failures are detected in step 114, then in step 116, the second fuse is made to indicate that memory failures are present in the second region. After step 116, the method terminates.

Figure 2:
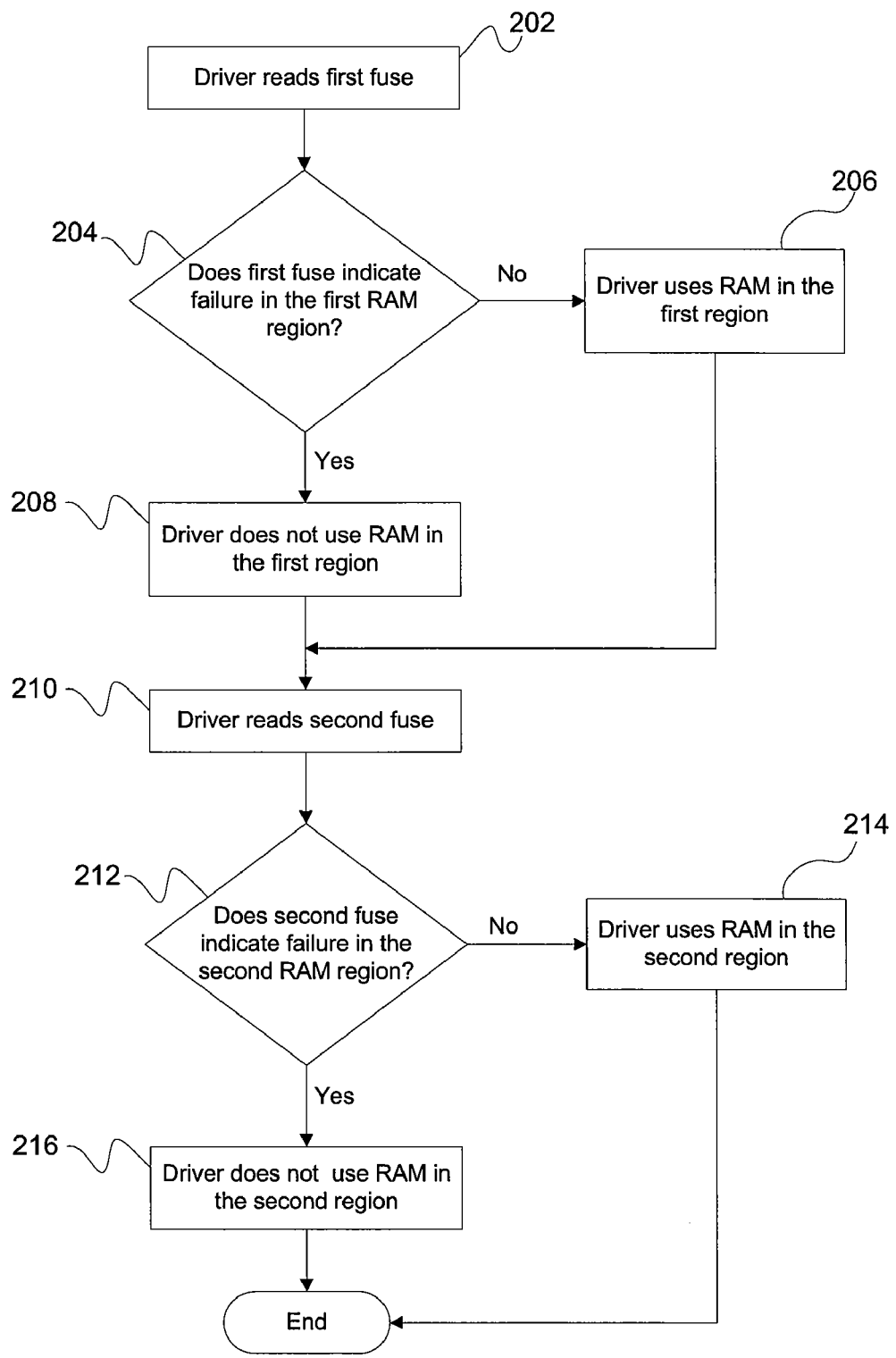
FIG. 2 is a flow chart of method steps for implementing an integrated circuit containing memory tested with the method of FIG. 1, according to one embodiment of the invention.

FIG. 2 is a flow chart of method steps for implementing an integrated circuit containing memory tested with the method of FIG. 1, according to one embodiment of the invention; Persons skilled in the art will understand that any system configured to perform the method steps in any order is within the scope of this invention.

As shown in FIG. 2, the method for using the tested integrated circuit begins with step 202, where a software driver reads the first fuse that was set during testing to determine if the first region of memory contains any failures. The software driver may include, without limitation, any software program or software routine that uses the memory within the integrated circuit. In step 204, the software driver determines whether the first fuse indicates that there are memory failures in the first memory region. If the first fuse indicates that there are no memory failures, then in step 206, the software driver uses the memory in the first region. If the first fuse indicates that there are one or more memory failures in the first memory region, then in step 208, the software driver does not use the memory in the first region. The method then proceeds to step 210 where the software driver reads the second fuse. In step 212, the software driver determines whether the second fuse indicates that there are memory failures in the second memory region. If the second fuse indicates that there are no failures in the second memory region, then in step 214, the software driver uses the memory in the second region, and the method then terminates. If the second fuse indicates that there are one or more memory failures in the second memory region, then in step 216, the driver does not use the memory in the second region, and the method terminates.

As the description of FIG. 2 indicates, the software driver is configured to use only the regions of memory that are free of memory failures. For example, in practice, if an integrated circuit were tested and found to posses no regions of memory that are free from failures, then that integrated circuit likely would be discarded. If, however, the part were nonetheless shipped, a software driver following the method of FIG. 2 would read fuses indicating that failures existed in all memory regions and, therefore, would not use any of the memory regions in the integrated circuit. Thus, through the use of the methods of FIGS. 1 and 2, integrated circuits with memory failures may be reclaimed instead of being discarded. The ability to reclaim and use integrated circuits that otherwise would have been discarded increases yield. Another advantage is that the approach described in FIGS. 1 and 2 does not significantly impact the die area associated with the integrated circuits.

Persons skilled in the art will understand that the foregoing methods may be used with any type of memory where the relevant system using that memory maintains its operational effectiveness when only part of or none of the memory is useable. Cache memory, random access memory (RAM) and Z-cull RAM are some examples of such memory elements.

Figure 3:
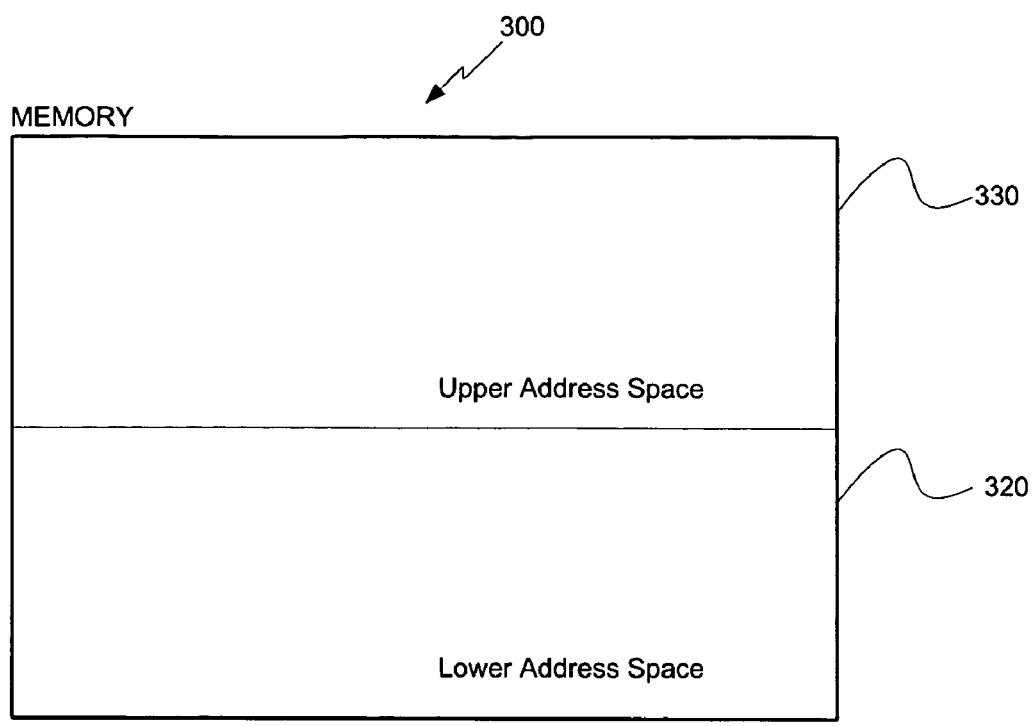
FIG. 3 is a conceptual diagram of a memory inside an integrated circuit, according to one embodiment of the invention.

FIG. 3 is a conceptual diagram of a memory 300 inside an integrated circuit, according to one embodiment of the invention. As shown, the memory 300 is divided by memory addresses into a first memory region 320 and a second memory region 330. The lower memory addresses are grouped into the first memory region 320, and the upper memory addresses are grouped into the second memory region 330. In alternative embodiments of the invention, the memory may be divided into more than two regions. In fact, in theory, there is no upper limit on the number of regions into which the memory may be divided. Among other things, dividing a memory into a greater number of regions provides more resolution on the location of any memory failures and potentially enables the use of a larger portion of the overall memory. In yet other embodiments, the memory may be divided by nibbles or other data bit groupings. As is well-known, a byte (bits 7 through bit 0) is comprised of two nibbles, a high nibble (bit 7 through bit 4) and a low nibble (bit 3 through bit 0). By dividing the memory by data groups instead of address groups, the failures in the memory may be better characterized for different applications.

Figure 4:
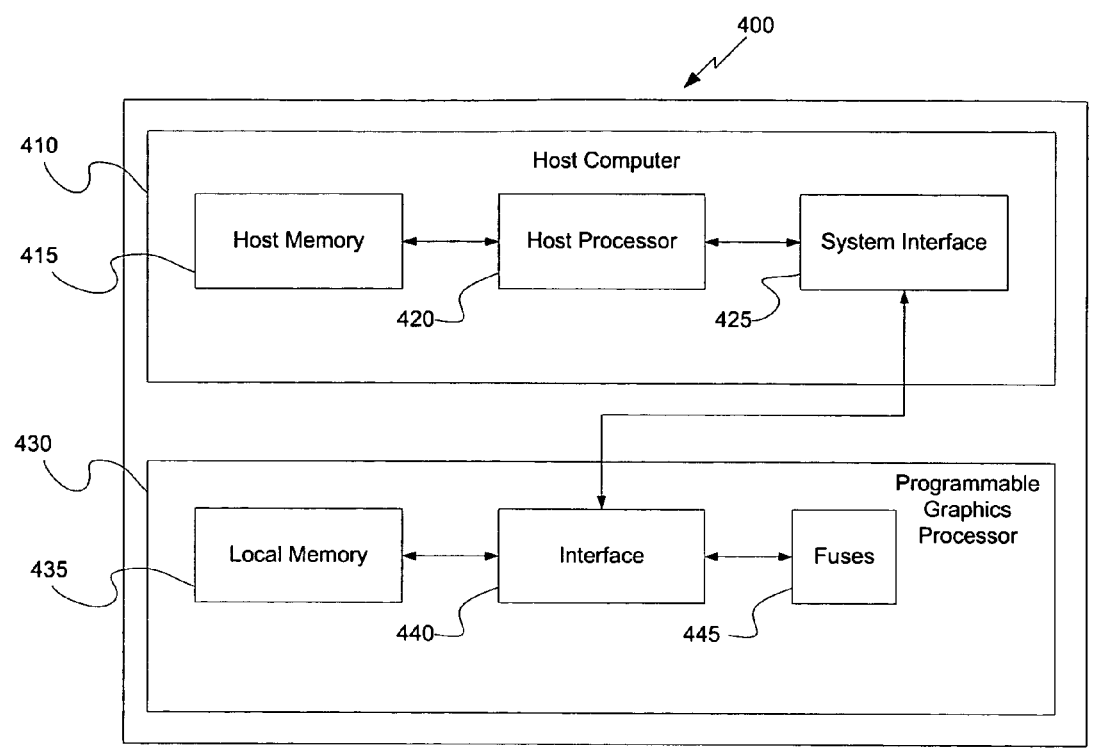
FIG. 4 is a conceptual diagram of a computer system that may be configured to implement one or more aspects of the present invention.

FIG. 4 is a conceptual diagram of a computer system 400 that may be configured to implement one or more aspects of the present invention. Computer system 400 may be a desktop computer, server, laptop computer, palm-sized computer, personal digital assistant, tablet computer, game console, cellular telephone, computer-based simulator or any other type of similar computing device. As shown, computer system 400 may include, without limitation, a host computer 410, host memory 415, host processor 420, system interface 425, programmable graphics processor 430, local memory 435, programmable graphics processor interface 440 and fuses 445.

The computer system 400 uses host memory 415 to store such programs such as the software driver, described in conjunction with FIG. 2, and data used by the host processor 420. The host processor 420 is connected to the system interface 425. The system interface 425 allows the host processor 420 to communicate to the sub-systems within the computer system 400 such as the programmable graphics processor 430. The system interface 425 is also connected to the programmable graphics processor interface 440. Local memory 435 and the fuses 445 are connected to the programmable graphics processor interface 440.

While the foregoing is directed to embodiments of the present invention, other and further embodiments of the invention may be devised without departing from the basic scope thereof, and the scope thereof is determined by the claims that follow.

The invention claimed is:

1. A computer system configured to use only regions of a memory element that do not include memory failures, the computing device comprising:
   a host device, including:
      a host memory that stores a software driver,
      host processor connected to the host memory and configured to execute the software driver, and
      a system interface connected to the host processor; and
   an integrated circuit, the integrated circuit including:
      a programmable graphics processor configured to process graphics commands;
      a graphics interface connected to the system interface and configured to communicate with the system interface, and
      a graphics memory element connected to the graphics interface, wherein the graphics memory element has a first region and a second region, a first memory state indicator that indicates whether the first region includes a memory failure, and a second memory state indicator that indicates whether the second region includes a memory failure;

wherein the software driver is configured to:
  read the first memory state indicator via the system interface and graphics interface to determine that the first region includes a memory failure;
  read the second memory state indicator via the system interface and graphics interface to determine that the second region does not include a memory failure; and
  use the second region and not use the first region.

2. The computer system of claim 1, wherein the first memory state indicator and the second memory state indicator comprise fuses.

3. The computer system of claim 1, wherein the first memory state indicator and the second memory state indicator comprise programmable read only memory.

4. The computer system of claim 1, wherein the graphics memory element is a random access memory.

5. The computer system of claim 4, wherein the random access memory is a z-cull random access memory.

* * * * *